(12) United States Patent
Sonoda

(10) Patent No.: US 6,366,503 B2
(45) Date of Patent: Apr. 2, 2002

(54) SEMICONDUCTOR STORAGE DEVICE

(75) Inventor: Masatoshi Sonoda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/741,635

(22) Filed: Dec. 19, 2000

(30) Foreign Application Priority Data

Dec. 20, 1999 (JP) ............................................ 11-361073

(51) Int. Cl.[7] ............................................. G11C 16/04
(52) U.S. Cl. .............................. 365/189.05; 365/225.7; 365/230.03; 365/201
(58) Field of Search ..................... 365/189.05, 225.7, 365/230.03, 201, 230.06, 230.05, 230.08; 257/529

(56) References Cited

U.S. PATENT DOCUMENTS

| | | | | |
|---|---|---|---|---|
| 5,708,618 A | * | 1/1998 | Toda et al. | 365/230.05 |
| 6,163,062 A | * | 12/1998 | Shiratake et al. | 257/529 |
| 6,088,284 A | * | 7/2000 | Lee et al. | 365/230.03 |
| 6,094,387 A | * | 7/2000 | Mine et al. | 365/201 |

FOREIGN PATENT DOCUMENTS

| | | | | |
|---|---|---|---|---|
| JP | 356090497 A | * | 7/1981 | ............ G11C/29/00 |
| JP | 8-315578 | | 11/1996 | |

* cited by examiner

*Primary Examiner*—David Nelms
*Assistant Examiner*—David Lam
(74) *Attorney, Agent, or Firm*—Darryl G. Walker

(57) ABSTRACT

A semiconductor storage device that can be selectable between input/output (I/O) configuration and have reduced area for data buses and/or reduced number of circuit elements is disclosed. According to one embodiment, a semiconductor storage device may include first and second memory cell arrays (10 and 12). Eighteen first sense amplifiers (SA(L)1–18) can be connected to the first memory cell array (10) and eighteen second sense amplifiers (SA(R) 1–18) can be connected to the second memory cell array (12). In addition, eighteen first I/O circuits (I/O(L)1–18) may correspond to the first sense amplifiers (SA(L)1–18) and eighteen second I/O circuits (I/O(R)1–18) may correspond to the second amplifiers (SA(R)1–18). Eighteen data buses (DB1–DB18) can be situated between the sense amplifiers (SA(L)1–18 and SA(R)1–18) and I/O circuits (I/O(L)1–18 and I/OR)1–18). Each data bus may be separated into at least two different portions by a disconnecting device (T1–T18). In one I/O configuration (e.g., x36), disconnecting devices (T1–T18) separate the data buses (DB1–DB18) into two different portions, in another I/O configuration (e.g., x18) the data buses (DB1–DB18) are not separated into different portions.

16 Claims, 4 Drawing Sheets

SEMICONDUCTOR STORAGE DEVICE

TECHNICAL FIELD

The present invention relates generally to semiconductor storage devices, and more particularly to semiconductor storage devices having selectable input and/or output bit configurations.

BACKGROUND OF THE INVENTION

Typically, a semiconductor storage device can receive input data and provide output data as a series of bits, most often in parallel. Different applications or users may have a desire for different input/output (I/O) bit widths. That is, while one application may desire an 18 bit (x18) I/O configuration, another might desire a 36 bit (x36) I/O configuration.

To take advantage of manufacturing in scale, in many cases the same basic semiconductor storage device design can be used for devices having different I/O configurations. Such an arrangement can be more economical, efficient and/or reliable than producing one design having one I/O configuration (e.g., x18), and producing another design having another I/O configuration (e.g., x36).

One conventional approach to selecting (or switching) between I/O configurations can include different wiring schemes. As but one example, Japanese Patent Application Laid-Open No. Hei 8-315578 discloses a semiconductor storage device which includes a memory cell array composed of a number of memory blocks, an I/O selecting section for selecting certain bit structures from a number of such bit structures, and a data selecting section for receiving an output signal from the I/O selecting section and switching the number of data inputs and data outputs.

FIG. 2 of the above-identified publication shows a structure that may be switched between a x18 and a x36 I/O configuration. In the structure shown, 36 data buses are provided in parallel. The 36 data buses can correspond to the x36 I/O configuration. Two data signal lines, that may be switched, are commonly connected to each data bus. In a x36 I/O configuration, the two signal lines commonly connected to the same data bus may be separated from one another resulting in one signal line being connected to one data bus. Data may then be input and output by way of data I/O circuits and the 36 data buses. In contrast, in a x18 I/O configuration, one of the two data signal lines commonly connected to the same data bus can be selected by the data selecting section. As a result, 18 of the data buses are used. Data may then be input and output by way of data I/O circuits and the 18 data buses.

In conventional approaches, such as that described above, data buses can be arranged in parallel. As the bit widths of semiconductor storage devices continues to grow, it can be difficult to accommodate larger and larger data buses on an integrated circuit. In addition, within a memory cell array region, a data selecting section can be included for each data signal line, to enable switching between the various I/O configurations (e.g., x36 and x18). Consequently, the number of circuit elements increases for such approaches. Increased circuit elements can increase overall memory size and/or complicate a design.

Conventional approaches may have further drawbacks. In many cases, the selection between I/O configurations can be accomplished by way of a mask change. As is well known in the art, a semiconductor storage device may be manufactured with a series of masks for patterning various layers. One conventional way of switching between I/O configurations can be done by changes between the sets of mask patterns for some interconnect layers, such as an aluminum wiring layer. Manufacturing such masks can be expensive. Further, layers, such as aluminum wiring layers, have to be changed in the fabrication process to accomplish switching between I/O configurations. Therefore, market demands for each I/O configuration have to be precisely estimated several months before the material is shipped. Thus, conventional masking approaches to I/O configurations are not always feasible in meeting rapidly changing demands for each I/O configuration.

In light of the above discussion, it would be desirable to arrive at a semiconductor storage device that includes selectable I/O configurations, while at the same time does not include as many parallel data bus lines or circuit elements as conventional approaches.

It would also be desirable to arrive at a memory device with selectable I/O configurations that may be switched to one particular I/O configuration more rapidly than conventional approaches.

SUMMARY OF THE INVENTION

According to the present invention, a semiconductor storage device that is selectable between at least two input/output (I/O) configurations may include a number of data buses that can be arranged in parallel. Each data bus may be separated into at least two sections by a disconnecting circuit. In one I/O configuration, the data buses are separated by the disconnecting circuits. In another I/O configuration, the data bus sections are joined by the disconnecting circuits.

According to one aspect of the present invention, a disconnecting circuit may include a transistor, more particularly an insulated gate field effect transistor, even more particularly an n-channel insulated gate field effect transistor.

According to one aspect of the present invention, a disconnecting circuit may include a fuse, more particularly a metal fuse, even more particularly a fuse comprising aluminum. A fuse may be formed from a wiring layer and have a line thickness less than other wiring lines. Such a fuse may be formed below a window in an insulating layer and can be openable by laser irradiation. In addition, or alternatively, a fuse may be formed below an insulating layer and connected to a wiring layer by holes through the insulating layer. Such a fuse can be openable by running current through the fuse by way of the wiring layer. The fuses of the data buses may be aligned with one another in one direction and/or offset from one another with respect to one direction.

According to another aspect of the invention, data buses may be separable into first portions and second portions. A semiconductor storage device may further include I/O circuits for accessing data buses. I/O circuits may include first I/O circuits coupled to the first portions of the data buses and second I/O circuits coupled to the second portions of the data buses. In one I/O configuration (e.g., x36), all of the I/O circuits may be activated. In another I/O configuration (e.g., x18), less than all of the first I/O circuits and less than all of the second I/O circuits may be activated.

According to another aspect of the embodiments, a semiconductor storage device may include first and second memory cell arrays. N sense amplifiers may be connected to the first memory cell array and N sense amplifiers may be connected to the second memory cell array. N I/O circuits may correspond to the N sense amplifiers connected to the first memory cell array, and N I/O circuits may correspond to the N sense amplifiers connected to the second memory cell array.

DETAILED DESCRIPTION OF THE EMBODIMENTS

Various embodiments of the present invention will now be described in detail with reference to a number of drawings.

Figure 1:
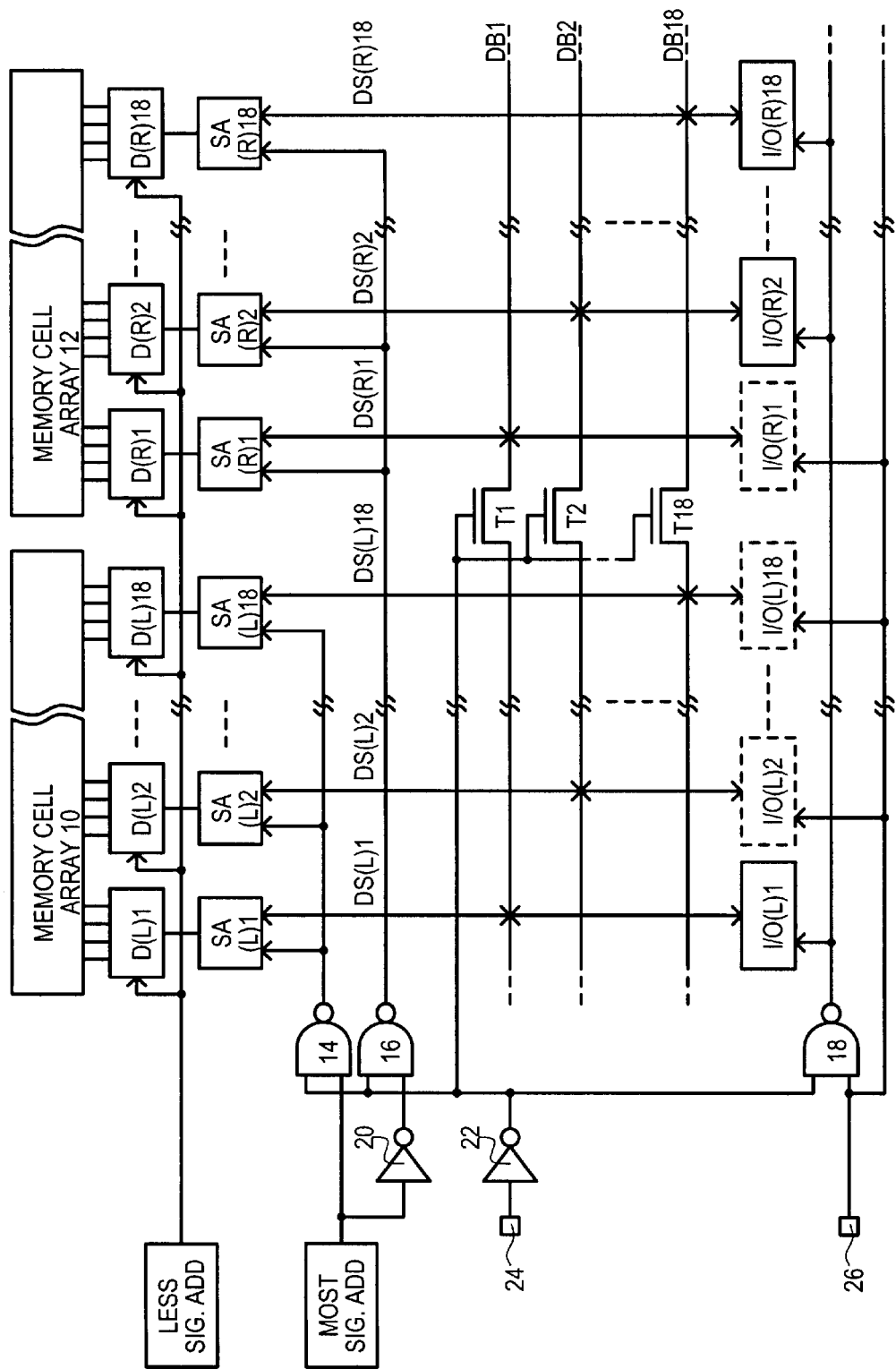
FIG. 1 is a block schematic diagram of a semiconductor storage device according to one embodiment.

Referring now to FIG. 1, a semiconductor storage device according to a first embodiment is set forth in a block schematic diagram. The particular example of FIG. 1 shows a semiconductor storage device that may be switched between a x36 input/output (I/O) configuration and a x18 I/O configuration. However, it is understood that the teachings set forth herein may be applied to switching between other types of I/O configuration.

A semiconductor storage device according to a first embodiment may include a number of memory cell arrays. In FIG. 1, two memory cell arrays are shown as items 10 and 12. In the example of FIG. 1, eighteen column decoders are connected to each memory cell array (10 and 12). In particular, column decoders D(L)1 to D(L)18 are connected to memory cell array 10, while column decoders D(R)1 to D(R)18 are connected to memory cell array 12. Bit line pairs from memory cell arrays (10 and 12) may be connected to the corresponding column decoders (D(L)1–18, and D(R) 1–18). According to a less significant address, each column decoder (D(L)1–18, and D(R)1–18) may connect a selected bit line to a corresponding sense amplifier (SA(L)1–18, and SA(R)1–18).

A first embodiment may also include eighteen data buses, DB1 to DB18 arranged in parallel. In particular arrangement, data buses (DB1 to DB18) may extend over a semiconductor substrate, essentially parallel to one another.

Transfer gates T1 to T18 may be situated in data buses DB1 to DB18, respectively. Transfer gates T1 to T18 may function as a disconnection means, disconnecting one portion of a data bus (e.g., a left hand portion) from another portion of the same data bus (e.g., a right hand portion). In one arrangement, transfer gates (T1 to T18) may be situated in a center position with respect to the data buses (DB1 to DB18).

If data buses (DB1 to DB18) are conceptualized as having left hand portions and right portions with respect to FIG. 1, sense amplifiers SA(L)1–18 and input/output circuits I/O(L) 1–18 can be connected to left hand portions of data buses DB1 to DB18, respectively, by data signal lines DS(L)1–18. Similarly, sense amplifiers SA(R)1–18 and input/output circuits I/O(R)1–18 can be connected to right hand portions of data buses DB1 to DB18, respectively, by data signal lines DS(R)1–18.

Sense amplifiers SA(L)1–18 and SA(R)1–18 may be activated and inactivated according to control signals. In the arrangement of FIG. 1, sense amplifiers SA(L)1–18, which can correspond to memory cell array 10, can be controlled by a signal generated from a NAND circuit 14. Similarly, sense amplifiers SA(R)1–18, which can correspond to memory cell array 12, can be controlled by a signal generated from a NAND circuit 16.

As noted above, the first embodiment may be selectable between a x36 and a x18 configuration. Various I/O circuits I/O(L)1–18 and I/O(R)1–18 may be activated or inactivated according to the particular I/O configuration. In the particular example of FIG. 1, those I/O circuits shown by broken lines (e.g., I/O(L)2, I/O(L)4 . . . I/O(L)18, and I/O(R)1, I/O(R)3 . . . to I/O(R)17) can be activated in both configurations (x36 and x18). However, those I/O circuits shown by solid lines (e.g., I/O(L)1, I/O(L)3 . . . I/O(L)17, and I/O(R)2, I/O(R)4 . . . I/O(R)18) can be activated in one configuration (x36) and inactivated in another configuration (x18). As also shown in FIG. 1, I/O circuits (I/O(L)1–18 and I/O(R)1–18) can be activated and inactivated according to an output of a NAND circuit 18 and the value at a test mode pin 26. The activation and inactivation of I/O circuits (I/O(L)1–18 and I/O(R)1–18) will be described in more detail at a later point herein.

The generation of various control signals in a first embodiment will now be described. As noted above, the outputs of NAND circuits 14 and 16 can activate and inactivate sense amplifiers (SA(L)1–18 and SA(R)1–18). In FIG. 1, an input of NAND circuits 14 and 16 may be connected to an I/O selection pin 24 by way of an inverter 22. In addition, NAND circuit 14 may receive an input corresponding to a most significant address, while NAND circuit 16 may receive the same input, but by way of an inverter 20.

As further shown in FIG. 1, an output of inverter 22 (i.e., an inverted selection input value) may also be supplied to transfer gates (T1 to T18). In the arrangement shown, transfer gates (T1 to T18) may comprise n-channel insulated gate field effect transistors having gates that are commonly connected to the output of inverter 22.

A NAND circuit 18, for activating and inactivating selected I/O circuits (I/O(L)1–17 and I/O(R)2–18), may have one input that receives a value at a test mode pin 26, and another input that receives the output of inverter 22 (inverted selection input value). In such an arrangement, a test mode pin 26 may be driven to a high level or low level during a wafer test. Such a wafer test will be described in more detail below. In one arrangement, following a wafer test, a test mode pin 26 can be fixed at a high level.

A method for selecting a x18 configuration and x36 configuration according to the embodiment of FIG. 1 will now be described.

In a x18 arrangement, an I/O selection pin 24 may be at a low level. As a result, the output of inverter 22 can be high. When a most significant address is high, the output of NAND circuit 14 may be at a low level while the output of NAND circuit 16 may be at a high level. Of course, when a most significant address is low, the output of NAND circuit 14 may be at a high level while the output of NAND circuit 16 may be at a low level. In this way, in a x18 configuration, sense amplifiers corresponding to memory cell array 10 (SA(L)1–18) or memory cell array 12 (SA(R)1–18) may be activated and inactivated according to a most significant address.

It is also noted that in a x18 configuration, with the output of inverter 22 high, transfer gate T1 to T18 may be turned on, connecting left hand portions of data buses DB1 to DB18 to right hand portions.

In addition, as noted above, a test mode pin 26 may be fixed at a high level. With a test mode pin 26 and the output of inverter 22 both high, the output of NAND circuit 18 may be low. Consequently those I/O circuits shown with solid lines (I/O(L)1, 3, 5, 7, 9, 11, 13, 15, 17 and I/O(R)2, 4, 6, 8, 10, 12, 14, 16, 18) can be inactivated. On the other hand, those I/O circuits shown with broken lines (I/O(L)2, 4, 6, 8, 10, 12, 14, 16, 18 and I/O(L)1, 3, 5, 7, 9, 11, 13, 15, 17), that are directly connected to a test mode pin 26, can be activated. Thus, in the embodiment of FIG. 1, 18 I/O circuits may be activated: 9 of the 18 I/O circuits corresponding to a memory cell 10 can be activated, while 9 out of 18 I/O circuits corresponding to a memory cell array 12 can be activated. Because each of the 18 activated I/O circuits can be connected to a different data bus (DB1 to DB18), data may be read and/or written by way of the 18 activated I/O circuits.

In this way, a semiconductor storage device with a x18 configuration can be realized.

In a x36 configuration, and I/O selection pin 24 may be at a high level. As a result, the output of inverter 22 can be low. With the output of inverter 22 low, the outputs of NAND circuits 14 and 16 can be high, activating sense amplifiers corresponding to both memory cell arrays 10 and 12 (SA(L)1–18 and SA(R)1–18).

It is also noted that in a x36 configuration, with the output of inverter 22 low, transfer gates (T1 to T18) may be turned off. With transfer gates (T1 to T18) off, data buses DB1 to DB18 can be divided into two sections. One section (i.e., a left hand section) may correspond to a memory cell array 10, while another section (i.e., a right hand section) may correspond to a memory cell array 12.

With a test mode pin 26 fixed at a high level, and the output of inverter 22 low, the output of NAND circuit 18 may be high. Consequently both the I/O circuits shown with solid lines and dashed lines (I/O(L)1–18 and I/O(R)1–18) can be activated.

Thus, in the embodiment of FIG. 1, all 36 I/O circuits may be activated. Because each of the 36 activated I/O circuits can be connected to a different data bus (DB1 to DB18) section, data may be read and/or written by way of the 36 activated I/O circuits.

In this way, a semiconductor storage device with a x36 configuration can be realized.

As mentioned above, a semiconductor storage device according to a first embodiment may also include a test capability. In particular, a semiconductor storage device may be subject to a wafer test. In a wafer test, it can be desirable to activate all the sense amplifiers. However, in an arrangement such as that shown in FIG. 1, with transfer gates T1 to T18 on, a sense amplifier corresponding to memory cell array 10 and sense amplifier corresponding to memory cell array 12 are both connected to the same data bus line, preventing such a test. For example, with transfer gate T1 on, sense amplifier SA(L)1 and SA(R)1 are both connected to data bus DB1. A first embodiment can vary the level of a test mode pin 26 to activate different sets of I/O circuits, thereby enabling a wafer test.

An example of such a wafer test will now be described.

In a wafer test, an I/O selection pin 24 can be fixed at a low level. As a result, the output of inverter 22 may be high. With the output of inverter 22 high, transfer gate T1 to T18 can be turned on. A test mode pin 26 may then be switched to a high level. With the output of inverter 22 high and a test mode pin 26 high, those I/O circuits indicated by broken lines (I/O(L)2, 4 . . . 18 and I/O(L)1, 3 . . . 17) can be activated, while those I/O circuits indicated by solid lines (I/O(R)1, 3 . . . 17 and I/O(L)2, 4 . . . 18) can be inactivated. In such a configuration, those I/O circuits indicated by broken lines can be connected to a single sense amplifier by a data bus. This can allow a test procedure to input and output data via such I/O circuits.

A test mode pin 26 may then be switched to a low level. With the output of inverter 22 high and a test mode pin 26 low, those I/O circuits indicated by broken lines (I/O(L)2, 4 . . . 18 and I/O(L)1, 3 . . . 17) can be inactivated, while those I/O circuits indicated by solid lines (I/O(R)1, 3 . . . 17 and I/O(L)2, 4 . . . 18) can be activated. In such a configuration, those I/O circuits indicated by solid lines can be connected to a single sense amplifier by a data bus. This can allow a test procedure to input and output data via such I/O circuits.

In a test mode such as that described above, a memory cell array connected to all of the sense amplifiers can be tested while a semiconductor storage device is in wafer form. Subsequently, the selection of a particular I/O configuration (e.g., x36 or x18) may be performed during an assembly process. As but one example, during an assembly process, a test mode pin 26 may be bonded to a high level supply, such as a power source VCC. An I/O selection pin 24 may then be bonded to a low power supply, such as ground, to select a x18 configuration, or may be bonded to a high power supply, such as a power source VCC, to select a x36 configuration.

Having described a first embodiment, a second embodiment will now be described with reference to FIG. 2. A second embodiment may include some of the same general constituents as the first embodiment. To that extent, like circuit portions will be referred to by the same reference characters. In a second embodiment, transfer gates (such as T1 to T18 shown in FIG. 1) can be replaced with fuses F1 to F18. Thus, a control line for turning transfer gates on and off can be omitted. In one particular arrangement fuses F1 to F18 may be aluminum (Al) fuses.

Selecting between different I/O configurations in the second embodiment can be similar to that of the first embodiment. However, while selection in a first embodiment can be accomplished by turning transfer gates T1 to T18 on and off, selection in a second embodiment can be accomplished by opening fuses F1 to F18 or keeping such fuses intact. More particularly, in a x36 arrangement, fuses F1 to F18 can be opened, while in a x18 configuration, fuses F1 to F18 can be kept intact.

A semiconductor storage device according to a second embodiment may have a number of advantages over a first embodiment. First, a second embodiment may have improved signal delay. A fuse, in particular an Al fuse, can have essentially no capacitance and small resistance as compared to a transfer gate. Second, a fuse may have the same performance as a transfer gate, but at a lower current. Third, fuses may be less vulnerable to noise than transfer gates. Fourth, the inclusion of a transfer gate in a data bus having a large capacitance and resistance may result in a lower operating frequency than if a fuse were included, particularly an Al fuse.

A fuse may be fabricated in a metallization process of a semiconductor storage device. As but one example, an Al fuse may be formed at the same time other Al wiring is being formed. Al fuses may have a smaller line width than other Al wiring. Further, an opening in an insulating layer may be provided over such Al fuses. Such fuses may then be opened by irradiation with a laser light. It is noted that in such a fuse arrangement, fuses may have to be separated from one another by a particular distance, as fuse material may be scattered when a fuse is opened. Consequently, such fuses may not be situated too close to one another.

Figure 2:
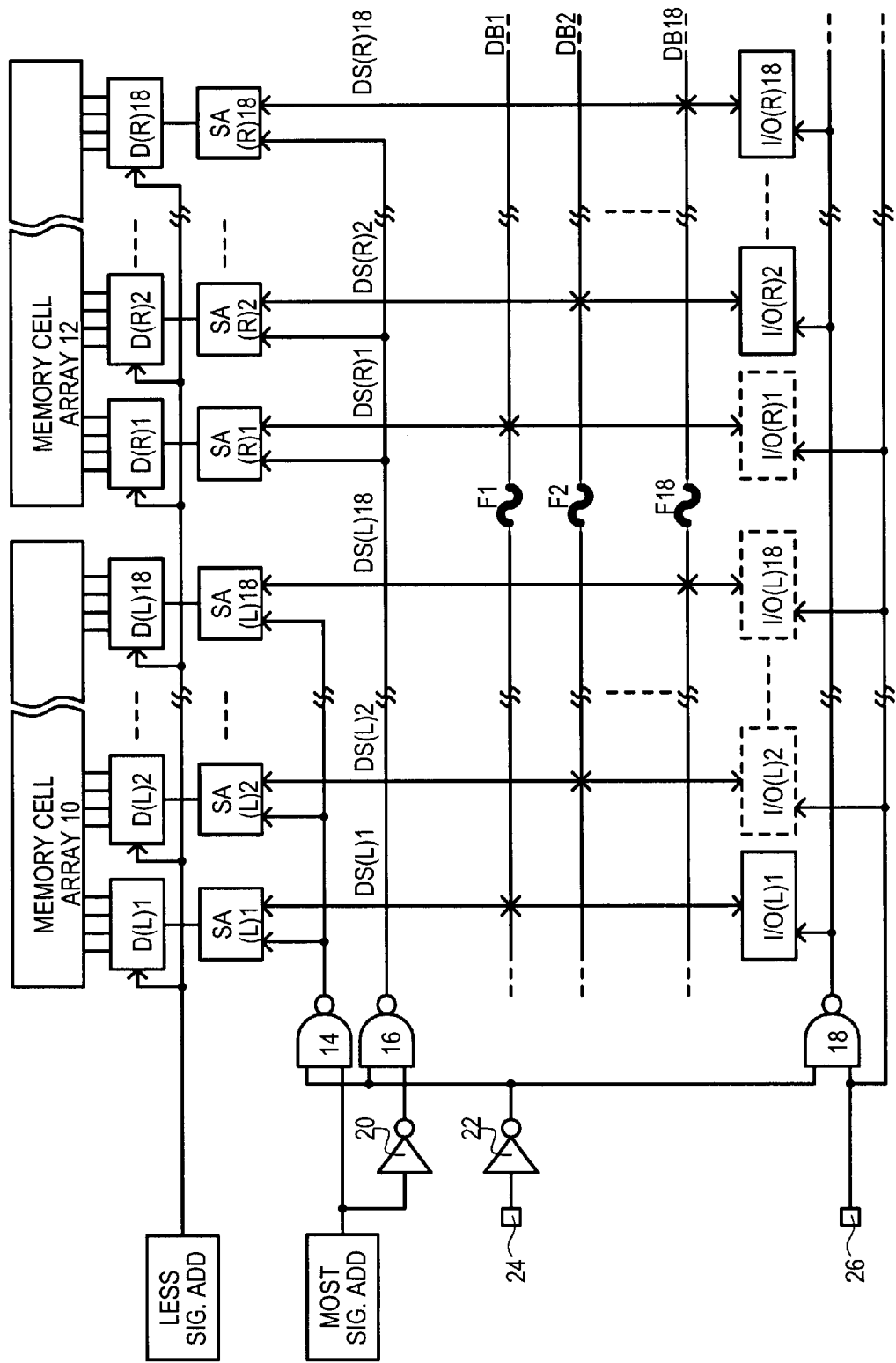
FIG. 2 is a block schematic diagram of a semiconductor storage device according to a second embodiment.
Figure 3:
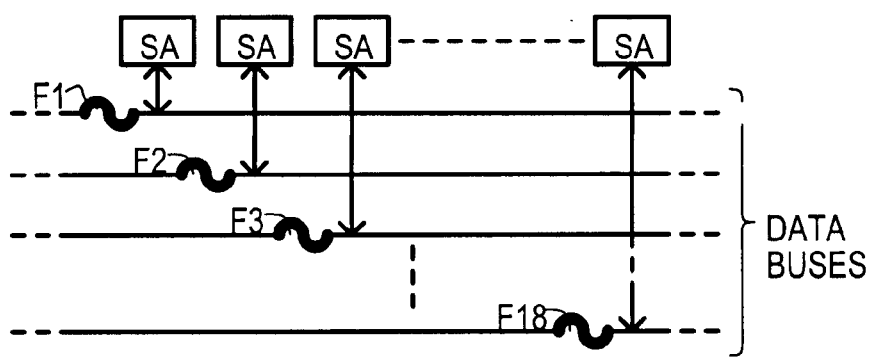
FIG. 3 is a schematic diagram of a fuse arrangement according to an embodiment.

If reference is made to FIG. 2, fuses F1 to F18 can be conceptualized as being arranged in parallel. If such fuses (F1 to F18) are formed as described above, such an arrangement may require a particular spacing interval between adjacent fuses. Consequently, increased area may be needed to accommodate such fuses. To avoid such a spacing constraint, fuses may be shifted from one another in the data bus direction. Such an arrangement is shown in FIG. 3.

An alternative way of forming a fuse, such as an Al fuse, can include burying a fuse below an insulating film with opposite ends of the fuse being connected to other wiring by way of holes in the insulating film. A fuse may then be opened by flowing current through the fuse. A fuse of this type has an advantage of not scattering fuse material in the opening process. Consequently, such fuses may have smaller spacing requirements than those described previously.

Either type of fuses, or other types of fuses, can be subject to failure for one reason or another. In a failed fuse, conductive material may remain after the opening process. Failed fuses may result in improper operation of a semiconductor storage device. To address such a potential failure, a semiconductor storage device may include multiple fuses connected in series. Such an arrangement is shown in FIGS. 4A and 4B.

Figure 4A:
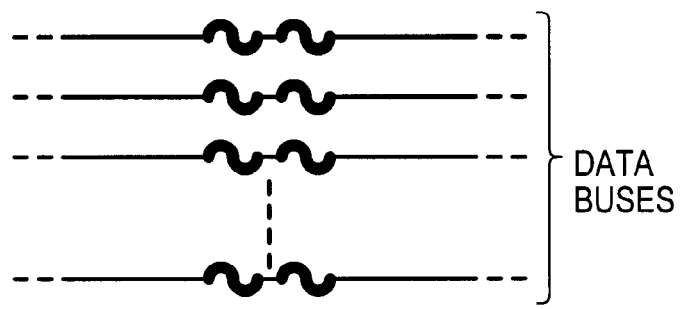
FIGS. 4A and 4B are a schematic diagram of a fuse arrangement according to other embodiments.
Figure 4B:
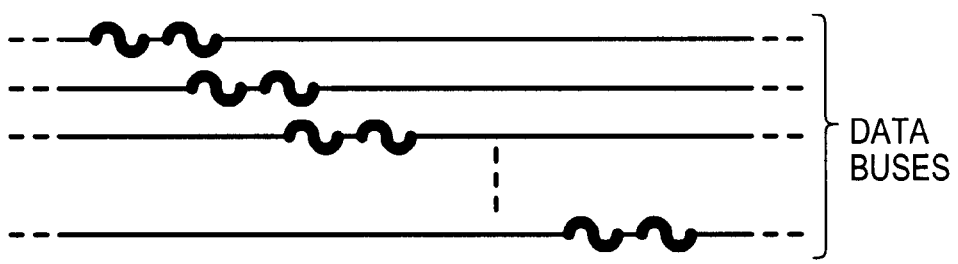

FIG. 4A can correspond to FIG. 2, in that fuses are situated in parallel. FIG. 4B can correspond to FIG. 3 in that fuses are shifted in the data bus direction. In such arrangements if one of the two fuses in series is left intact, successfully opening another is enough to achieve the desired functionality. This reduces the probability of failure in opening fuses.

Having described various embodiments that may include fuses, one example of a wafer test according to such embodiments will now be described.

Referring back to FIG. 2, in a wafer test operation, an I/O selection pin 24 may be fixed at a low level while fuses F1 to F18 are intact. A test mode pin 26 may then be placed at a high level. As a result, the output of NAND circuit 18 can be driven low. In such a configuration, those I/O circuits indicated by broken lines (I/O(L)2, 4 . . . 18 and I/O(R)1, 3 . . . 17) can be activated, while those I/O circuits indicated by solid lines (I/O(L)1, 3 . . . 17 and I/O(R)2, 4 . . . 18) can be inactivated. In such a configuration, those I/O circuits indicated by broken lines can be connected to a single sense amplifier by a data bus. This can allow a test procedure to input and output data via such I/O circuits.

A test mode pin 26 may then be switched to a low level. With the output of inverter 22 high and a test mode pin 26 low, those I/O circuits indicated by broken lines (I/O(L)2, 4 . . . 18 and I/O(R)1, 3 . . . 17) can be inactivated, while those I/O circuits indicated by solid lines (I/O(L)1, 3 . . . 17 and I/O(R)2, 4 . . . 18) can be activated. In such a configuration, those I/O circuits indicated by solid lines can be connected to a single sense amplifier by a data bus. This can allow a test procedure to input and output data via such I/O circuits.

In this way, a wafer test may advantageously test the operation of each I/O circuit.

An I/O configuration may be selected in a wafer test, not in the fabrication process. In a semiconductor storage device such as that shown in FIG. 2, an I/O configuration can be selected by manipulating fuses. More particularly, if a x18 configuration is desired, fuses F1 to F18 can be kept intact. If a x36 configuration is desired, fuses F1 to F18 can be opened. In addition, an I/O selection pin 24 can have a particular bonding arrangement according to the configuration. More particularly, a test mode pin 26 may be bonded to a high level, such as a power source VCC. In addition, an I/O selection pin 24 may be bonded to a high level, such as a power source VCC, for a x36 configuration. For a x18 configuration, an I/O selection pin 26 may be bonded to a low level, such as ground.

A layout arrangement for an embodiment including fuses, such as that shown in FIG. 2, will now be described.

Figure 5:
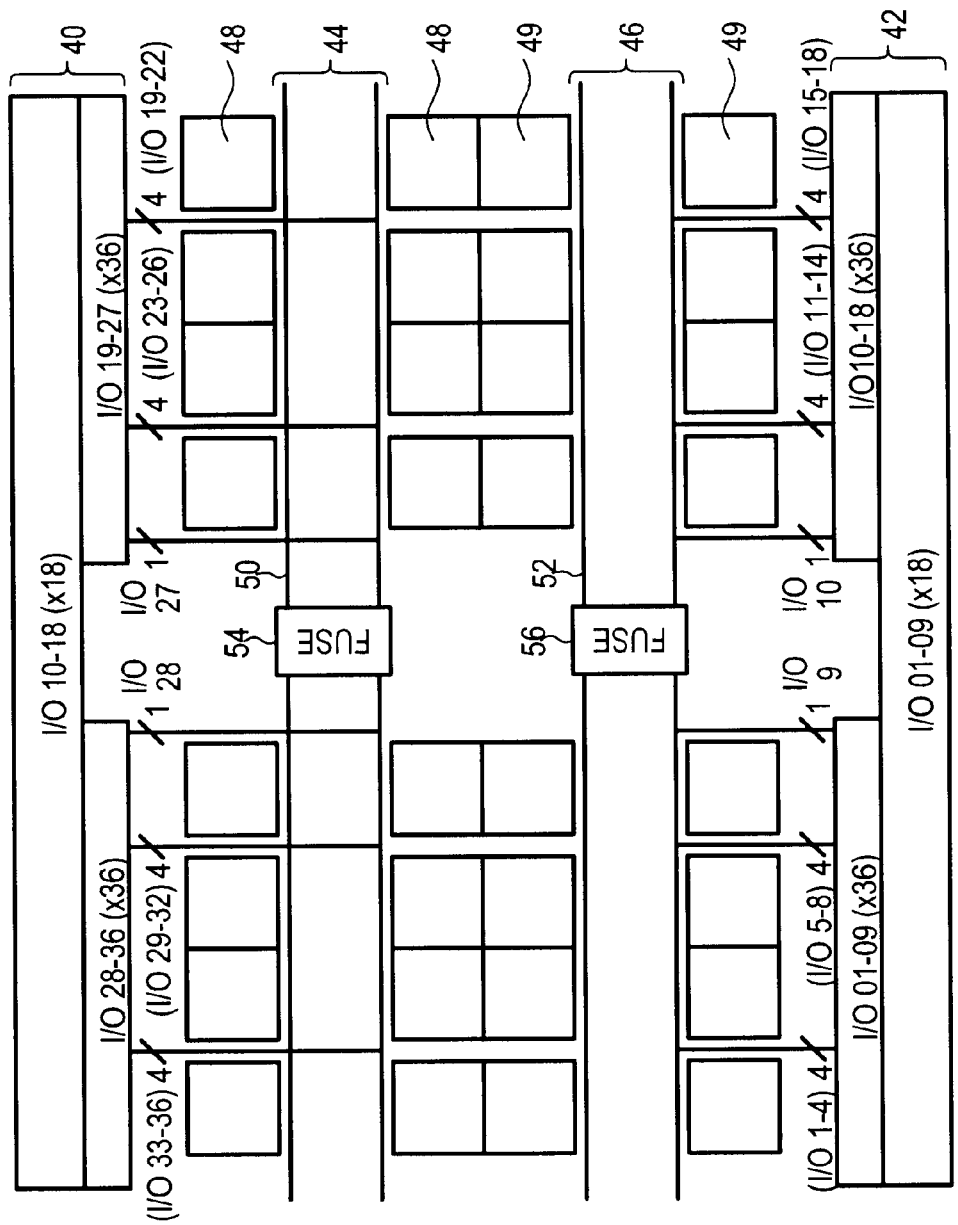
FIG. 5 is a diagram showing a layout of a semiconductor storage device according to an embodiment.

Referring now to FIG. 5, a chip layout is shown for a semiconductor storage device. FIG. 5 shows an example of a 4 megabyte memory. In FIG. 5, I/O circuits may be arranged in I/O circuit rows 40 and 42 disposed on opposing sides of a chip. Each I/O circuit row (40 and 42) may include eighteen I/O circuits.

A layout may also include bus regions 44 and 46, that can correspond to I/O circuit rows 40 and 42, respectively. A bus region 44 may include data buses 50 and bus region 46 may include data buses 52. In the example shown, data buses (50 and 52) may each include nine data buses arranged in parallel.

FIG. 5 also shows fuses 54 and 56. Fuses 54 may be situated at essentially the center of data buses 50. Similarly, fuses 56 may be situated at essentially the center of data buses 52. Fuses (54 and 56) may comprise Al fuses, variations of which were described above.

A layout may further include memory cell arrays. Particular memory cell arrays are identified in FIG. 5 as items 48 and 49. Memory cell arrays 48 may be situated on opposing sides of data buses 50, while memory cell arrays 49 may be situated on opposing sides of data buses 52. Memory cell arrays (48 and 49) may be selected according to addresses. In response to an applied address, memory cell arrays (48 and 49) may provide access to memory cells corresponding to various I/O circuits.

In an arrangement such as that shown in FIG. 5, nine I/O circuits in each I/O circuit row (40 and 42) may be situated on one side of a semiconductor storage device (e.g., a left side), while a different nine I/O circuits in each I/O circuit row (40 and 42) may be situated on another side of a semiconductor storage device (e.g., a right side). In a x36 configuration, all I/O circuits may be activated. However, in a x18 configuration, four I/O circuits may be activated on one side, while five may be activated on another.

It is believed that a layout such as that shown in FIG. 5 may reduce overall chip size, only 18 data buses need to exist to support x36 I/O configuration.

As shown by the various embodiments, a semiconductor storage device can provide selectable outputs without necessarily having as many data buses as the maximum number of selectable outputs. In this way, the area required for data buses may be reduced over other conventional approaches.

Still further, in the described embodiments, a data selecting section for each data signal line may not be included, as in conventional cases. Thus, a semiconductor device according to one embodiment may have fewer circuit elements than conventional approaches.

It is also noted that while Al fuses have been described as possible fuses in the various examples, the present invention is not limited to such fuses. As but a few examples, alternate fuse materials may include other metals, such as copper, silver, gold, tungsten, titanium, or the like. Materials having a low resistivity are preferable.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor storage device selectable between at least a first input/output (I/O) configuration and a second I/O configuration, comprising:
   a plurality of data buses formed over a substrate;
   a disconnection device comprising a transfer gate in each data bus that divides the data bus into at least two sections in the second I/O configuration and form a conductive portion of the data bus in the first I/O configuration;
   first I/O circuits coupled to one of the data bus sections; and
   second I/O circuits coupled to another of the data bus sections.

2. The semiconductor storage device of claim 1, wherein:
   the transfer gate consists of a field effect transistor having a source-drain path as part of the data bus.

3. A semiconductor storage device selectable between at least two types of input/output (I/O) configurations, comprising:
   a first memory cell array;
   a second memory cell array;
   a plurality of sense amplifiers, including
      N first sense amplifiers coupled to the first memory cell array, where N is an integer equal to or larger than 2;
      N second sense amplifiers coupled to the second memory cell array;
   a plurality of I/O circuits including
      N first I/O circuits corresponding to the first sense amplifiers;
      N second I/O circuits corresponding to the second sense amplifiers;
   N data buses formed on a semiconductor substrate between the sense amplifiers and the I/O circuits, each data bus including a disconnection circuit that separates the data bus into at least a first section and second section in one state and joins at least the first section and second section in a second state, the first sections of the data buses being coupled to the first sense amplifiers and the second sections of the data buses being coupled to the second sense amplifiers, the disconnection circuits separating the data buses or joining the at least first sections and second sections of the data buses according to a particular I/O configuration; and
   an I/O activation circuit that activates less than all of the first I/O circuits and less than all of the second I/O circuits in a test mode.

4. The semiconductor storage device of claim 3, wherein: the disconnection circuit comprises a transfer gate.

5. The semiconductor storage device of claim 3, wherein: the disconnection circuit comprises a fuse formed from at least one type of metal.

6. The semiconductor storage device of claim 5, wherein: the fuse comprises a portion of a metal wiring layer that has a narrower line width than adjoining portions, and is formed below an opening in an insulating layer and openable by laser irradiation.

7. The semiconductor storage device of claim 5, wherein:
   the fuse is formed below an insulating film and includes opposing ends that are connected to a wiring layer via holes formed in the insulating film, the fuse being openable by current supplied from the wiring layer.

8. The semiconductor storage device of claim 3, wherein:
   each disconnection circuit comprises a plurality of fuses arranged in series.

9. The semiconductor device of claim 3, wherein:
   the disconnection circuits are aligned in a direction essentially perpendicular to the direction of the data buses.

10. The semiconductor storage device of claim 3, wherein:
    the disconnection circuits have an oblique a alignment with respect to the direction of the data buses.

11. The semiconductor storage device of claim 3, wherein:
    the particular I/O configurations include a first I/O configuration and a second I/O configuration, the disconnection circuits joining the at least first sections and second sections of the data buses in the second I/O configuration and separation the data buses in the first I/O configuration.

12. The semiconductor storage device of claim 11, wherein:
    the first I/O configuration provides access to thirty six memory cells (x36) in an operation and the second I/O configuration provides access to eighteen memory cells (x18) in an operation.

13. A semiconductor device, comprising:
    plurality of data buses each separable into a first portion and a second portion according to a particular input/output (I/O) configuration; and
    a plurality of I/O circuits including first I/O circuits coupled to the first portions of the data buses and second I/O circuits coupled to the second portions of the data buses; and
    an I/O control circuit that activates all of the first and second I/O circuits in a first I/O configuration, and less than all of the first I/O circuits and less than all of the second I/O circuits in a second I/O configuration.

14. The semiconductor device of claim 13, wherein:
    the first I/O configuration provides access to X memory cells, where X is an integer greater than 2, and the second I/O configuration provides access to X/2 memory cells.

15. The semiconductor device of claim 13, wherein:
    the data buses are separable by a separation circuit having circuit elements selected from the group consisting of transistors and fuses.

16. The semiconductor device of claim 13, further including:
    a plurality of sense amplifiers, including first sense amplifiers coupled to the first portions of the data buses and second sense amplifiers coupled to the second portions of the data buses.

* * * * *